(12) United States Patent
Sawabe et al.

(10) Patent No.: US 10,790,396 B2
(45) Date of Patent: Sep. 29, 2020

(54) SEMICONDUCTOR DEVICE AND METHOD FOR MANUFACTURING THE SAME

(71) Applicant: TOSHIBA MEMORY CORPORATION, Minato-ku, Tokyo (JP)

(72) Inventors: Tomoaki Sawabe, Tokyo (JP); Tomomasa Ueda, Yokohama Kanagawa (JP); Keiji Ikeda, Kawasaki Kanagawa (JP); Tsutomu Tezuka, Yokohama Kanagawa (JP); Nobuyoshi Saito, Tokyo (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 21 days.

(21) Appl. No.: 16/103,880

(22) Filed: Aug. 14, 2018

(65) Prior Publication Data
US 2019/0296155 A1 Sep. 26, 2019

(30) Foreign Application Priority Data

Mar. 21, 2018 (JP) .................................. 2018-053641

(51) Int. Cl.
*H01L 29/786* (2006.01)
*H01L 29/423* (2006.01)
(Continued)

(52) U.S. Cl.
CPC .. *H01L 29/78696* (2013.01); *H01L 27/10802* (2013.01); *H01L 27/10808* (2013.01); *H01L 29/42392* (2013.01); *H01L 29/4908* (2013.01); *H01L 29/513* (2013.01); *H01L 29/66969* (2013.01); *H01L 29/7788* (2013.01); *H01L 29/7869* (2013.01); *H01L 29/78642* (2013.01); *H01L 21/44* (2013.01); *H01L 21/47635* (2013.01); *H01L 29/517* (2013.01); *H01L 29/518* (2013.01); *H01L 2029/42388* (2013.01)

(58) Field of Classification Search
CPC ......... H01L 27/11582; H01L 27/11524; H01L 27/1157; H01L 21/02123; G11C 16/0483
See application file for complete search history.

(56) References Cited

U.S. PATENT DOCUMENTS 5,308,782 A 5/1994 Mazure et al.
9,698,272 B1 * 7/2017 Ikeda ................ H01L 29/78606
(Continued)

FOREIGN PATENT DOCUMENTS

JP H06-013623 A 1/1994
JP 2015-109426 A 6/2015
(Continued)

*Primary Examiner* — Jonathan Han
(74) *Attorney, Agent, or Firm* — Foley & Lardner LLP

(57) ABSTRACT

A semiconductor device of an embodiment includes a first electrode; a second electrode; an oxide semiconductor layer provided between the first electrode and the second electrode and extending in a first direction; a gate electrode surrounding the oxide semiconductor layer; and a first gate insulating layer provided between the gate electrode and the oxide semiconductor layer, the first gate insulating layer surrounding the oxide semiconductor layer, and the first gate insulating layer having a length in the first direction shorter than a length of the oxide semiconductor layer in the first direction.

17 Claims, 16 Drawing Sheets

(51) Int. Cl.
H01L 29/49 (2006.01)
H01L 29/51 (2006.01)
H01L 29/66 (2006.01)
H01L 27/108 (2006.01)
H01L 29/778 (2006.01)
H01L 21/44 (2006.01)
H01L 21/4763 (2006.01)

(56) References Cited

U.S. PATENT DOCUMENTS

2014/0225181 A1* 8/2014 Makala ............... H01L 29/7889
                                                         257/321
2016/0079268 A1* 3/2016 Sakuma ............ H01L 27/11582
                                                          257/43
2017/0053986 A1* 2/2017 Liu ................... H01L 27/11556

FOREIGN PATENT DOCUMENTS

| JP | 2016-063027 A | 4/2016 |
|----|---------------|--------|
| JP | 2017-168623 A | 9/2017 |

* cited by examiner

SEMICONDUCTOR DEVICE AND METHOD FOR MANUFACTURING THE SAME

CROSS-REFERENCE TO RELATED APPLICATION

This application is based upon and claims the benefit of priority from Japanese Patent Application No. 2018-053641, filed on Mar. 21, 2018, the entire contents of which are incorporated herein by reference.

FIELD

Embodiments described herein relate generally to a semiconductor device and a method for manufacturing the same.

BACKGROUND

An oxide semiconductor transistor including an oxide semiconductor layer as a channel layer has an excellent characteristic that a channel leakage current during an off-operation is extremely small. However, degradation of transistor characteristics, for example, an increase of a gate leakage current, an increase of an on-resistance, and the like, becomes significant along with scaling-down of the oxide semiconductor transistor.

DETAILED DESCRIPTION

Figure 1:
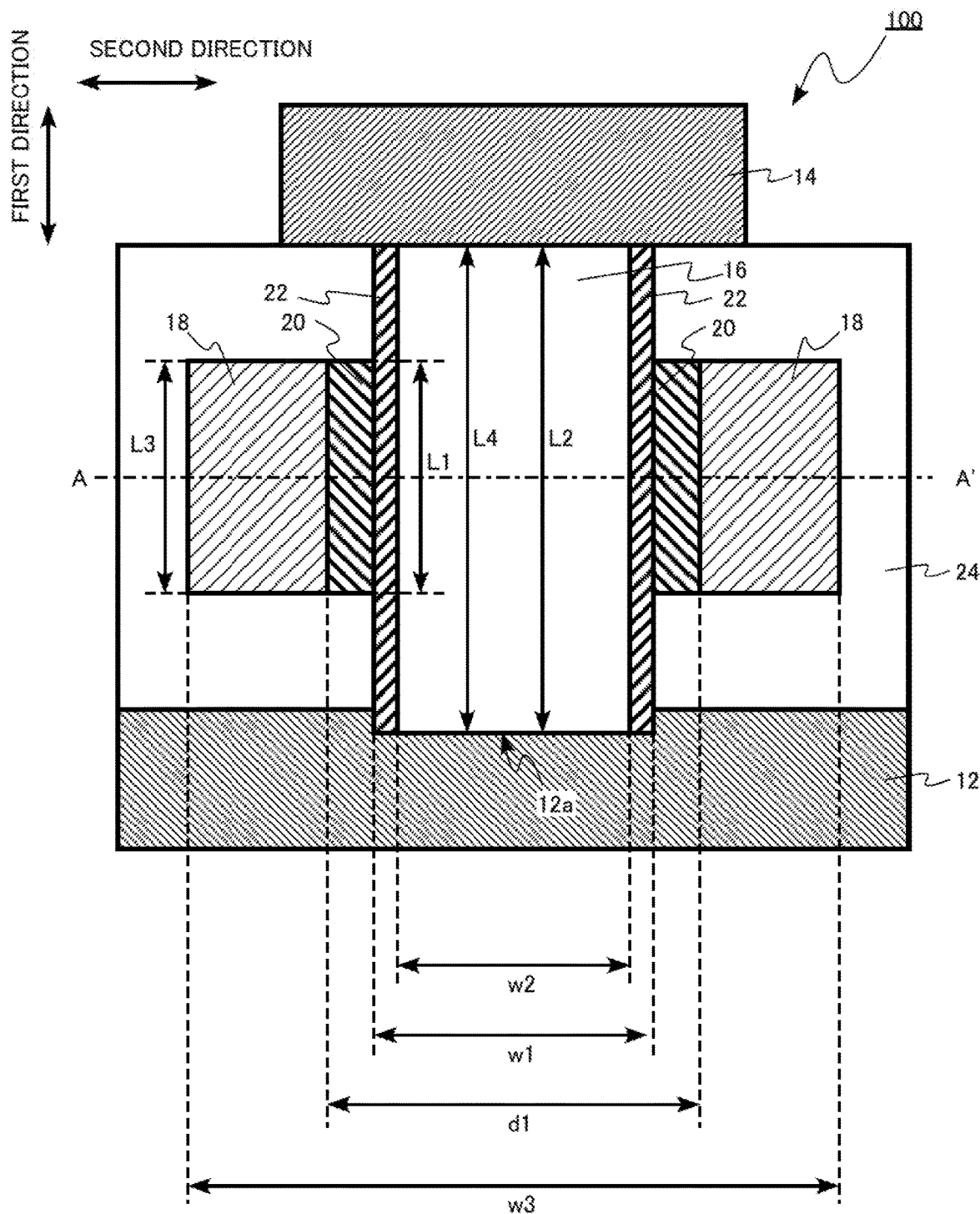
FIG. 1 is a schematic cross-sectional view of a semiconductor device of a first embodiment.

A semiconductor device of an embodiment includes: a first electrode; a second electrode; an oxide semiconductor layer provided between the first electrode and the second electrode and extending in a first direction; a gate electrode surrounding the oxide semiconductor layer; and a first gate insulating layer provided between the gate electrode and the oxide semiconductor layer, the first gate insulating layer surrounding the oxide semiconductor layer, and the first gate insulating layer having a length in the first direction shorter than a length of the oxide semiconductor layer in the first direction.

Hereinafter, embodiments of the present disclosure will be described with reference to the drawings. In the following description, the same or equivalent parts and the like will be denoted by the same reference numerals, and parts that have been once described will not be described as appropriate.

In the present specification, the term "above" or "below" may be used for the sake of convenience. The term "above" or "below" is merely a term indicating a relative positional relationship within a drawing and is not a term that defines a positional relationship with respect to gravity.

Qualitative analysis and quantitative analysis of chemical compositions of the parts forming the semiconductor device in the present specification can be carried out by secondary ion mass spectroscopy (SIMS) and energy dispersive X-ray spectroscopy (EDX). In addition, it is possible to use a transmission electron microscope (TEM), for example, for measurement of a thickness of the part, forming the semiconductor device, a distance between parts, and the like.

First Embodiment

A semiconductor device of a first embodiment includes a first electrode; a second electrode; an oxide semiconductor layer provided between the first electrode and the second electrode and extending in a first direction; a gate electrode surrounding the oxide semiconductor layer; and a first gate insulating layer provided to surround the oxide semiconductor layer between the gate electrode and the oxide semiconductor layer and having a length in the first direction shorter than a length of the oxide semiconductor layer in the first direction. Further, the semiconductor device of the first embodiment includes a second gate insulating layer provided to surround the oxide semiconductor layer between the first gate insulating layer and the oxide semiconductor layer and having a length in the first direction longer than a length of the first gate insulating layer in the first direction.

Figure 2:
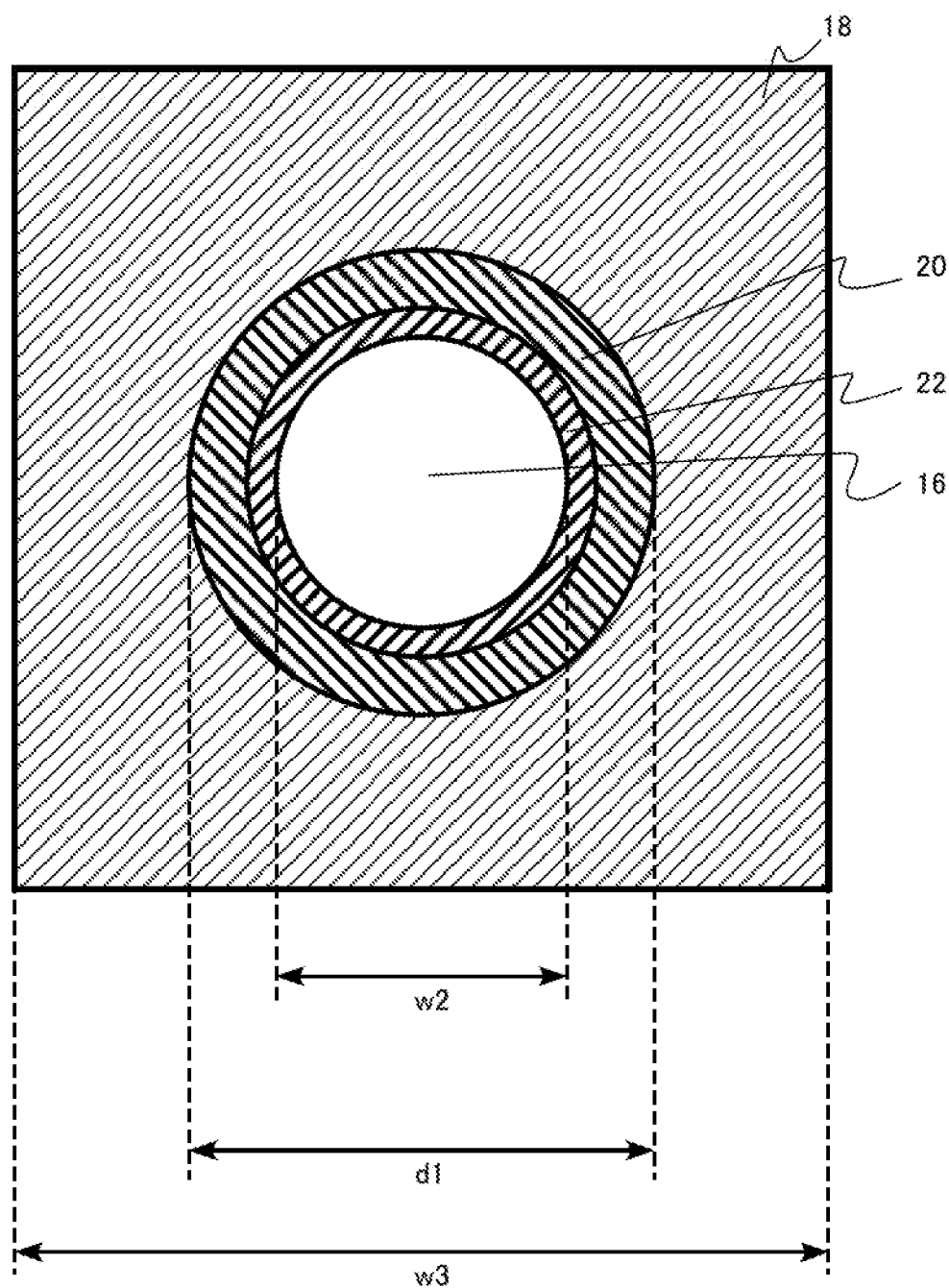
FIG. 2 is a schematic cross-sectional view of the semiconductor device of the first embodiment.

FIGS. 1 and 2 are schematic cross-sectional views of the semiconductor device of the first embodiment. FIG. 2 is the cross-sectional view taken along a line AA' of FIG. 1.

The semiconductor device of the first embodiment is a transistor 100. The transistor 100 is an oxide semiconductor transistor including an oxide semiconductor as a channel layer. The transistor 100 is a so-called surrounding gate transistor (SGT) in which a gate electrode is provided to surround the channel layer. The transistor 100 is a so-called vertical transistor.

The transistor 100 includes a source electrode 12 (first electrode), a drain electrode 14 (second electrode), a channel layer 16 (oxide semiconductor layer), a gate electrode 18, a first gate insulating layer 20, a second gate insulating layer 22, and an interlayer insulating layer 24.

The source electrode 12 is an example of the first electrode. The source electrode 12 has a front surface (first plane) and a back surface (second plane) opposite to the front surface. A distance between the front surface and the channel layer 16 is smaller than a distance between the back surface and the channel layer 16. The source electrode 12 is, for example, metal, a metal compound, a semiconductor, or a conductive oxide. The source electrode 12 may have a stacked structure of two or more kinds of materials. The source electrode 12 is, for example, a stacked structure of metal and a conductive oxide. The source electrode 12 is, for example, a stacked structure of tungsten (W) and indium tin oxide (ITO). For example, a front surface of the source electrode 12, which is on a side of the channel layer 16 is indium tin oxide.

The source electrode 12 has a recess 12a right below the channel layer 16. The front surface of the source electrode 12 has a recess 12a. The channel layer 16 positioned between the recess 12a and the drain electrode 14. The recess 12a is a groove formed by overetching at the time of forming an opening for formation of the channel layer 16. A width (w1 in FIG. 1) of the recess 12a in a second direction orthogonal to the first direction is, for example, between 10 nm and 50 nm. FIG. 1 is a cross section parallel to the first direction and including the channel layer 16.

The drain electrode 14 is an example of the second electrode. The drain electrode 14 is, for example, metal, a metal compound, a semiconductor, or a conductive oxide. The drain electrode 14 may have a stacked structure of two or more kinds of materials. The drain electrode 14 is, for example, a stacked structure of metal and a conductive oxide. The drain electrode 14 is, for example, a stacked structure of tungsten (W) and indium tin oxide (ITO). For example, a surface of the drain electrode 14 on the side of the channel layer 16 is indium tin oxide.

The channel layer 16 is provided between the source electrode 12 and the drain electrode 14. The channel layer 16 extends in the first direction. The first direction is a direction connecting the source electrode 12 and the drain electrode 14. The channel layer 16 is an example of the oxide semiconductor layer. During an on-operation of the transistor 100, a channel serving as a current path is formed in the channel layer 16.

The channel layer 16 is an oxide semiconductor. The channel layer 16 contains, for example, indium (In). The channel layer 16 contains, for example, indium oxide and gallium oxide, indium oxide and zinc oxide, or indium oxide and tin oxide. The channel layer 16 is, for example, so-called IGZO (InGaZnO) containing indium oxide, gallium oxide, and zinc oxide.

A width (w2 in FIG. 1) of the channel layer 16 in the second direction orthogonal to the first direction is, for example, between 10 nm and 50 nm.

The gate electrode 18 is provided to surround the channel layer 16. The gate electrode 18 is provided around the channel layer 16.

The gate electrode 18 is, for example, metal, a metal compound, or a semiconductor. The gate electrode 18 is, for example, tungsten.

A width (w3 in FIG. 1) of the gate electrode 18 in the second direction is, for example, between 30 nm and 60 nm. A distance (d1 in FIG. 1) between portions of the gate electrode 18 that sandwich the channel layer 16 is, for example, between 20 nm and 50 nm.

The distance d1 between the portions of the gate electrode 18 that sandwich the channel layer 16 in the second direction is larger than the width w1 of the recess 12a in the second direction. The distance d1 is, for example, between 1.1 times and 1.5 times of the width w1.

The distance d1 between the portions of the gate electrode 18 that sandwich the channel layer 16 in the second direction is, for example, 0.8 times or more of the width w3 of the gate electrode 18 in the second direction.

The first gate insulating layer 20 is provided between the gate electrode 18 and the channel layer 16. The first gate insulating layer 20 is provided to surround the channel layer 16. The first gate insulating layer 20 is, for example, an oxide or an oxynitride. A thickness of the first gate insulating layer 20 is, for example, 2 nm to 10 nm.

A length (L1 in FIG. 1) of the first gate insulating layer 20 in the first direction is shorter than a length (L2 in FIG. 1) of the channel layer 16 in the first direction. The length L1 of the first gate insulating layer 20 in the first direction is substantially the same as a length (L3 in FIG. 1) of the gate electrode 18 in the first direction.

The second gate insulating layer 22 is provided between the first gate insulating layer 20 and the channel layer 16. The second gate insulating layer 22 is provided to surround the channel layer 16. The second gate insulating layer 22 is, for example, an oxide or an oxynitride. A thickness of the second gate insulating layer 22 is, for example, 2 nm to 10 nm.

The second gate insulating layer 22 is made of, for example, a different material from the first gate insulating layer 20. The second gate insulating layer 22 may be made of the same material as the first gate insulating layer 20, for example.

A length (L4 in FIG. 1) of the second gate insulating layer 22 in the first direction is longer than the length L1 of the first gate insulating layer 20 in the first direction. The length L4 of the second gate insulating layer 22 in the first direction is longer than the length L3 of the gate electrode 18 in the first direction. The length L4 of the second gate insulating layer 22 in the first direction is substantially equal to the length L2 of the channel layer 16 in the first direction.

The interlayer insulating layer 24 is provided, for example, between the source electrode 12 and the gate electrode 18, and between the drain electrode 14 and the gate electrode 18. The interlayer insulating layer 24 performs electrical isolation of the source electrode 12, the drain electrode 14, and the gate electrode 18. The interlayer insulating layer 24 is, for example, an oxide. The interlayer insulating layer 24 is, for example, silicon oxide.

Next, an example of a method for manufacturing the semiconductor device of the first embodiment will be described.

The method for manufacturing the semiconductor device of the first embodiment includes forming a first electrode; forming a first interlayer insulating film on the first electrode; forming a gate electrode on the first interlayer insulating film; forming a second interlayer insulating film on the gate electrode; forming an opening penetrating through the second interlayer insulating film, the gate electrode, and the first interlayer insulating film and reaching the first electrode; etching the gate electrode exposed on a side face of the opening in a lateral direction in a range where the gate electrode remains; forming a first gate insulating layer in a region where the gate electrode is etched in the lateral direction; embedding the opening with an oxide semiconductor layer; and forming a second electrode on the oxide semiconductor layer.

FIGS. 3, 4, 5, 6, 7, 8, and 9 are schematic cross-sectional views illustrating the method for manufacturing the semiconductor device of the first embodiment.

First, the source electrode 12 is formed. The source electrode 12 is formed, for example, using deposition of a film by a chemical vapor deposition (CVD) method and patterning by a lithography method and a reactive ion etching (RIE) method.

Next, the first interlayer insulating film 51 is formed on the source electrode 12. The first interlayer insulating film 51 is formed using, for example, deposition of a film by a CVD method and planarization by a chemical mechanical polishing (CMP) method. The first interlayer insulating film 51 is, for example, silicon oxide.

Next, the gate electrode 18 is formed on the first interlayer insulating film 51. The gate electrode 18 is formed, for example, using deposition of a film by a CVD method and patterning by a lithography method and an RIE method.

Figure 3:
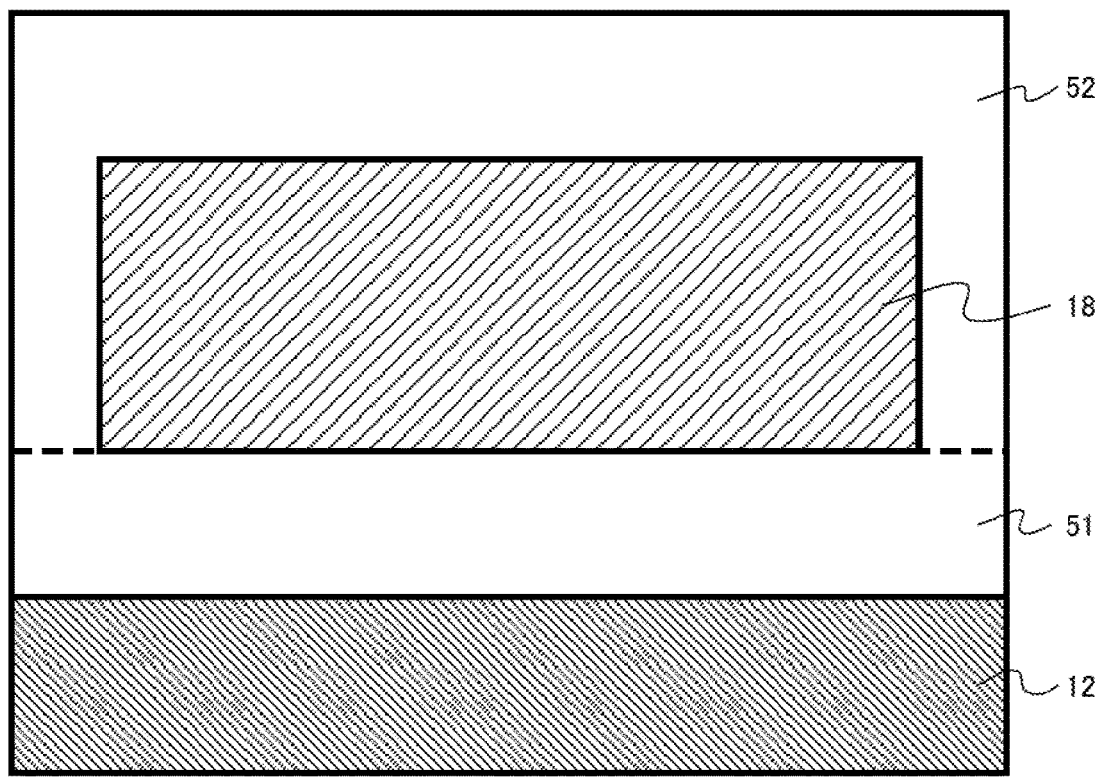
FIG. 3 is a schematic cross-sectional view illustrating a method for manufacturing the semiconductor device of the first embodiment.

Next, the second interlayer insulating film 52 is formed on the gate electrode 18. The second interlayer insulating film 52 is formed, for example, using deposition of a film by a CVD method and planarization by a CMP method (FIG. 3).

Figure 4:
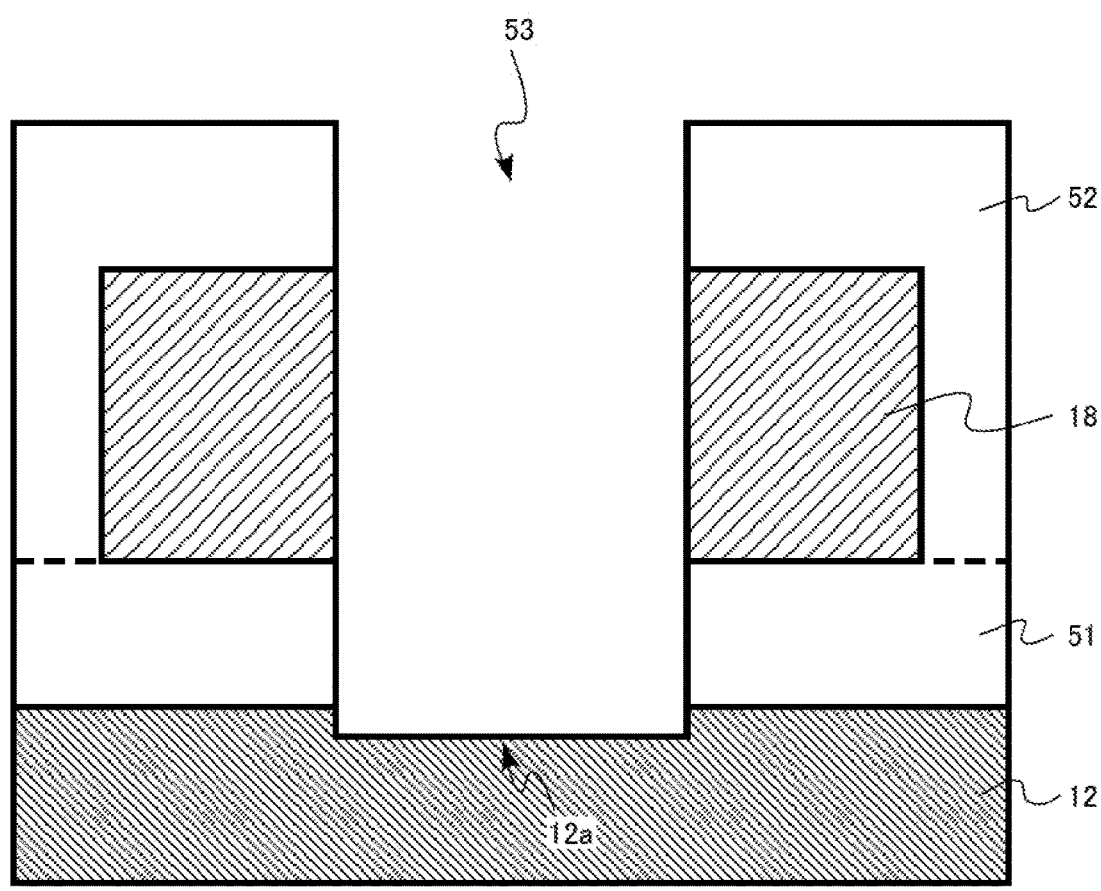
FIG. 4 is a schematic cross-sectional view illustrating the method for manufacturing the semiconductor device of the first embodiment.

Next, an opening 53 that penetrates through the second interlayer insulating film 52, the gate electrode 18, and the first interlayer insulating film 51 and reaches the source electrode 12 is formed (FIG. 4). The opening 53 is formed, for example, using a lithography method and patterning by an RIE method.

When the opening 53 is formed, the source electrode 12 exposed at the opening 53 is removed by overetching to form the recess 12a.

Figure 5:
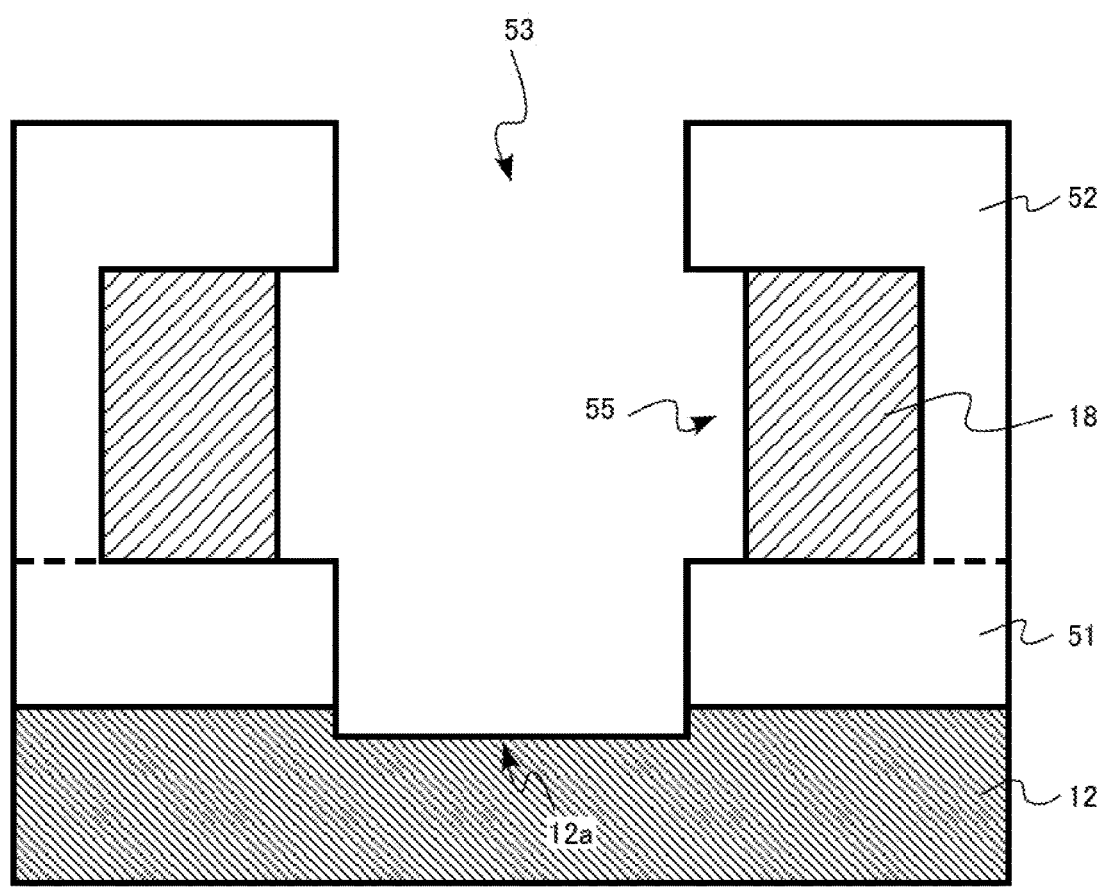
FIG. 5 is a schematic cross-sectional view illustrating the method for manufacturing the semiconductor device of the first embodiment.

Next, the gate electrode 18 exposed on a side face of the opening 53 is etched in a lateral direction in a range where the gate electrode 18 remains (FIG. 5). With the etching of the gate electrode 18 in the lateral direction, a recess region 55 where the gate electrode 18 retreats in the lateral direction is formed. The gate electrode 18 is etched, for example, by isotropic dry etching.

It is preferable to select a material which is hardly shaved by the etching of the gate electrode 18 as a material of the source electrode 12 from the viewpoint of suppressing etching of the source electrode 12 exposed on a bottom face of the opening 53 during the etching of the gate electrode 18.

Figure 6:
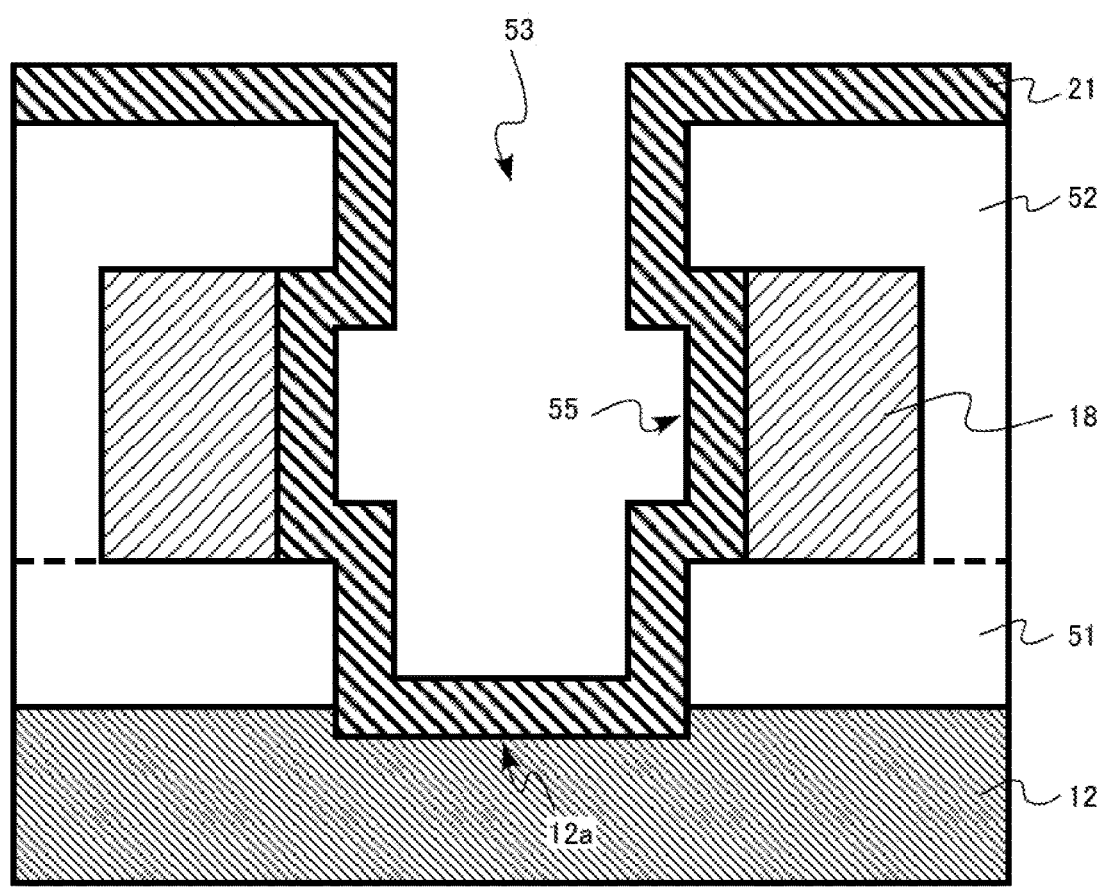
FIG. 6 is a schematic cross-sectional view illustrating the method for manufacturing the semiconductor device of the first embodiment.

Next, a film 21 for formation of the first gate insulating layer 20 is deposited (FIG. 6). The film 21 is deposited by, for example, an atomic layer deposition (ALP) method.

Figure 7:
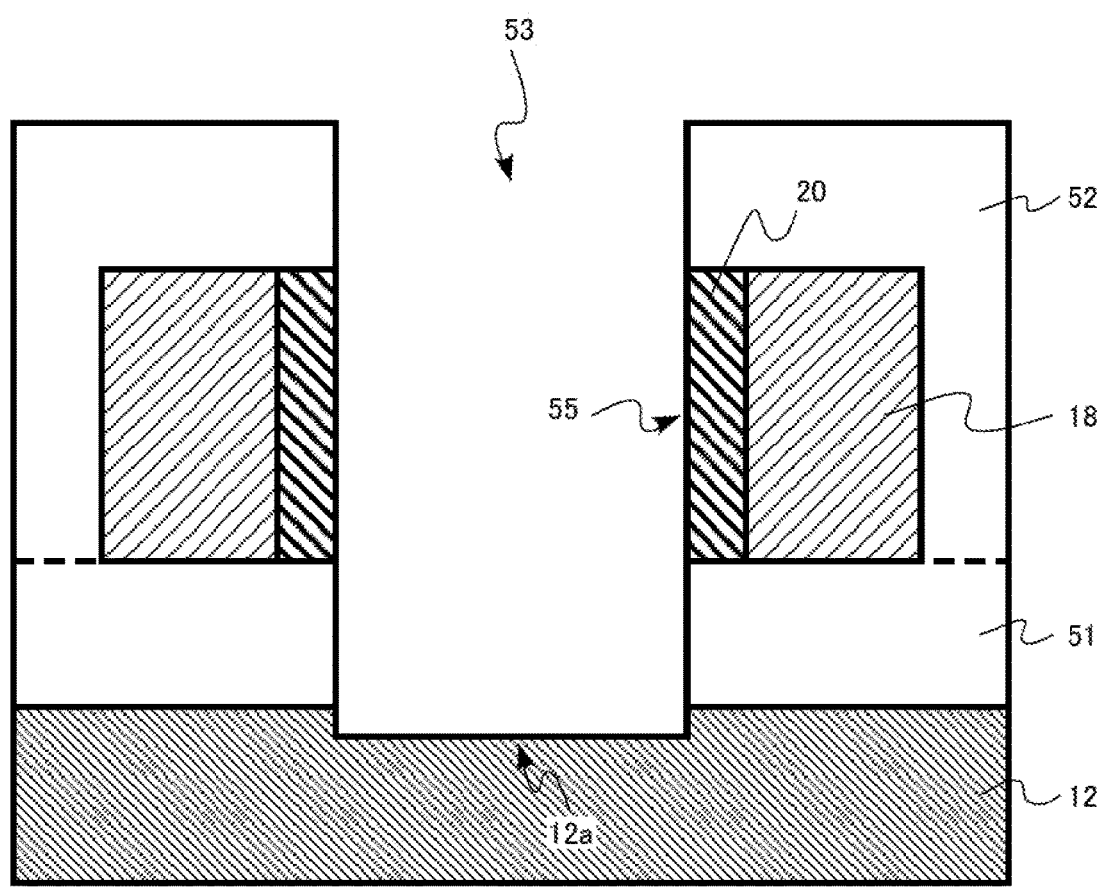
FIG. 7 is a schematic cross-sectional view illustrating the method for manufacturing the semiconductor device of the first embodiment.

Next, the film 21 in a region other than the recess region 55 is removed by, for example, an RIE method (FIG. 7). As the film 21 in the region other than the recess region 55 is removed, the first gate insulating layer 20 is formed in the recess region 55.

Figure 8:
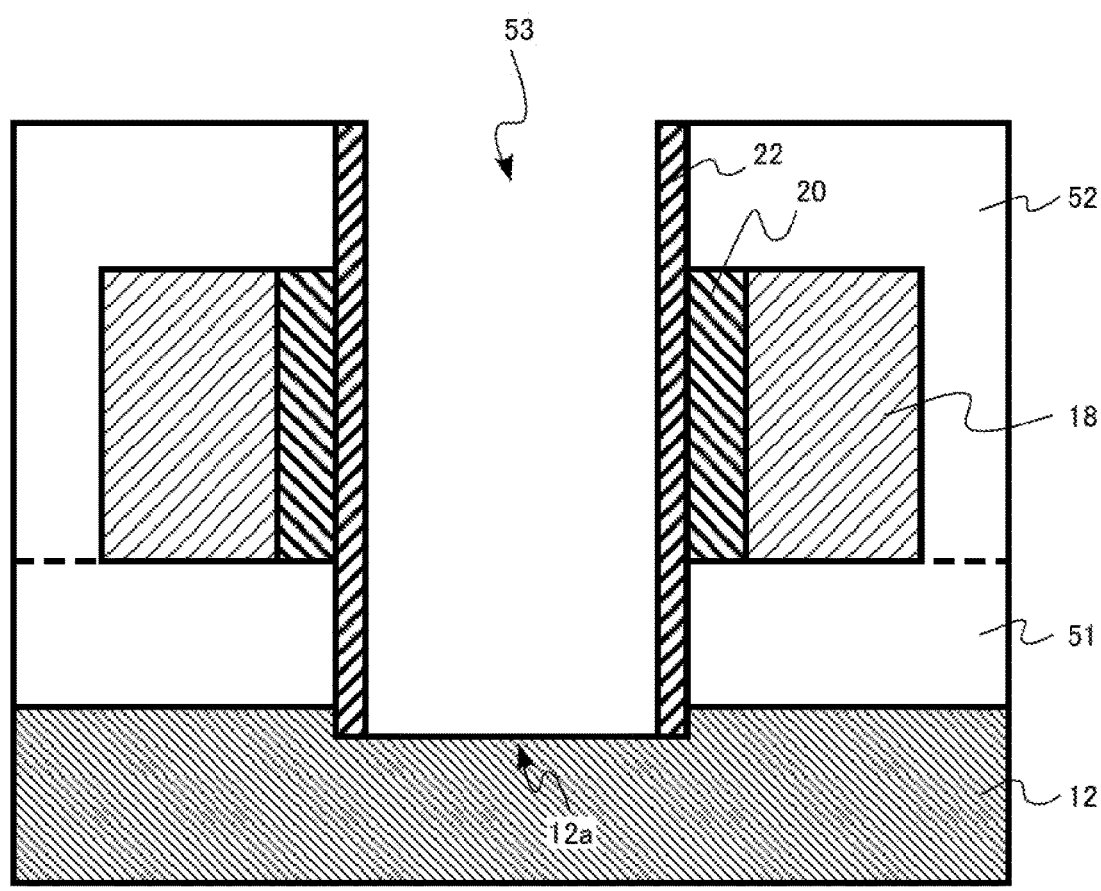
FIG. 8 is a schematic cross-sectional view illustrating the method for manufacturing the semiconductor device of the first embodiment.

Next, the second gate insulating layer 22 is formed in the opening 53 (FIG. 8). The second gate insulating layer 22 is formed, for example, using deposition of a film for the second gate insulating layer 22 (not illustrated) by an ALD method and etching by an RIE method.

Figure 9:
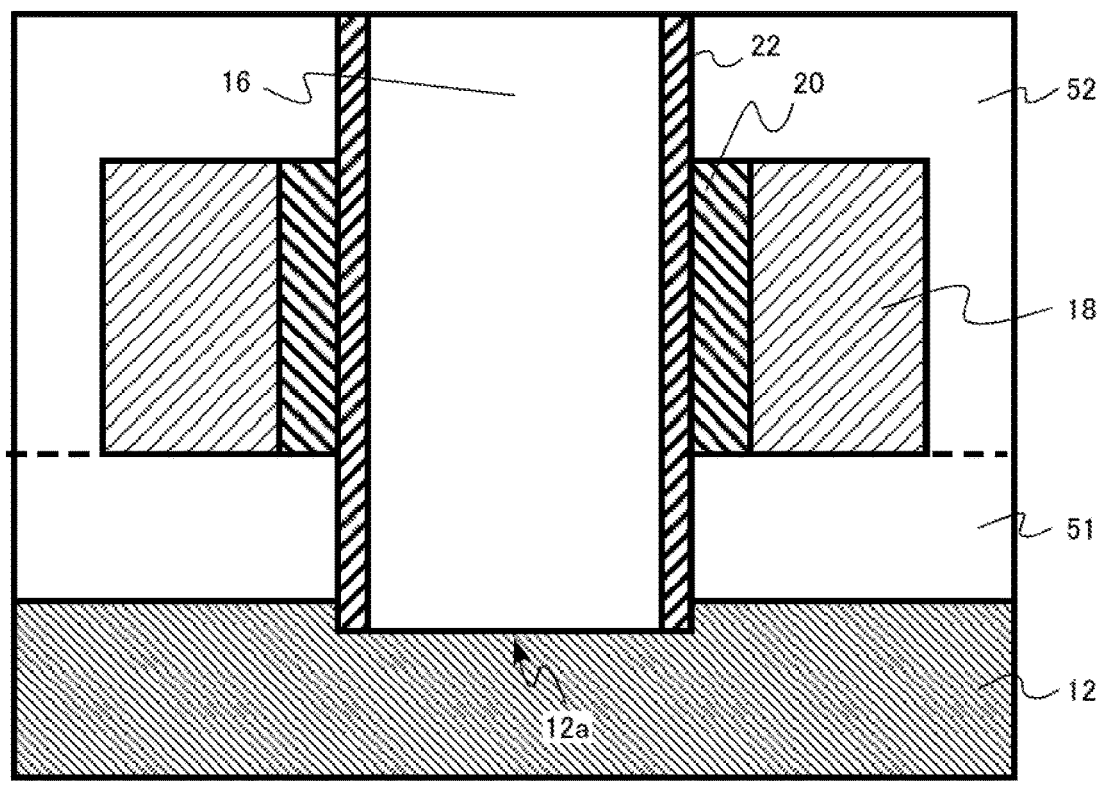
FIG. 9 is a schematic cross-sectional view illustrating the method for manufacturing the semiconductor device of the first embodiment.

Next, the opening 53 is embedded with the channel layer 16 (FIG. 9). For example, the channel layer 16 is formed using deposition of an oxide semiconductor film (not illustrated) by an ALD method and planarization by an CMP method.

Then, the drain electrode 14 is formed on the channel layer 16. The drain electrode 14 is formed, for example, using deposition of a film by a CVD method and patterning by a lithography method and an RIE method.

The transistor 100 of the first embodiment illustrated in FIGS. 1 and 2 is manufactured with the above-described manufacturing method.

Hereinafter, a function and an effect of the semiconductor device of the first embodiment and the method for manufacturing the same will be described.

An oxide semiconductor transistor including an oxide semiconductor layer as a channel layer has an excellent characteristic that a channel leakage current during an off-operation is extremely small. However, degradation of transistor characteristics, for example, an increase of a gate leakage current, an increase of an on-resistance, and the like, becomes significant along with scaling-down of the oxide semiconductor transistor.

In the transistor 100 of the first embodiment, the first gate insulating layer 20 is formed in the recess region 55 which has been formed by etching the gate electrode 18 in the lateral direction. With this structure, it is possible to increase the thickness of the gate insulating layer and to reduce the gate leakage current. Alternatively, it is possible to increase the width of the channel layer 16 and to reduce the on-resistance. Details will be described hereinafter.

Figure 10:
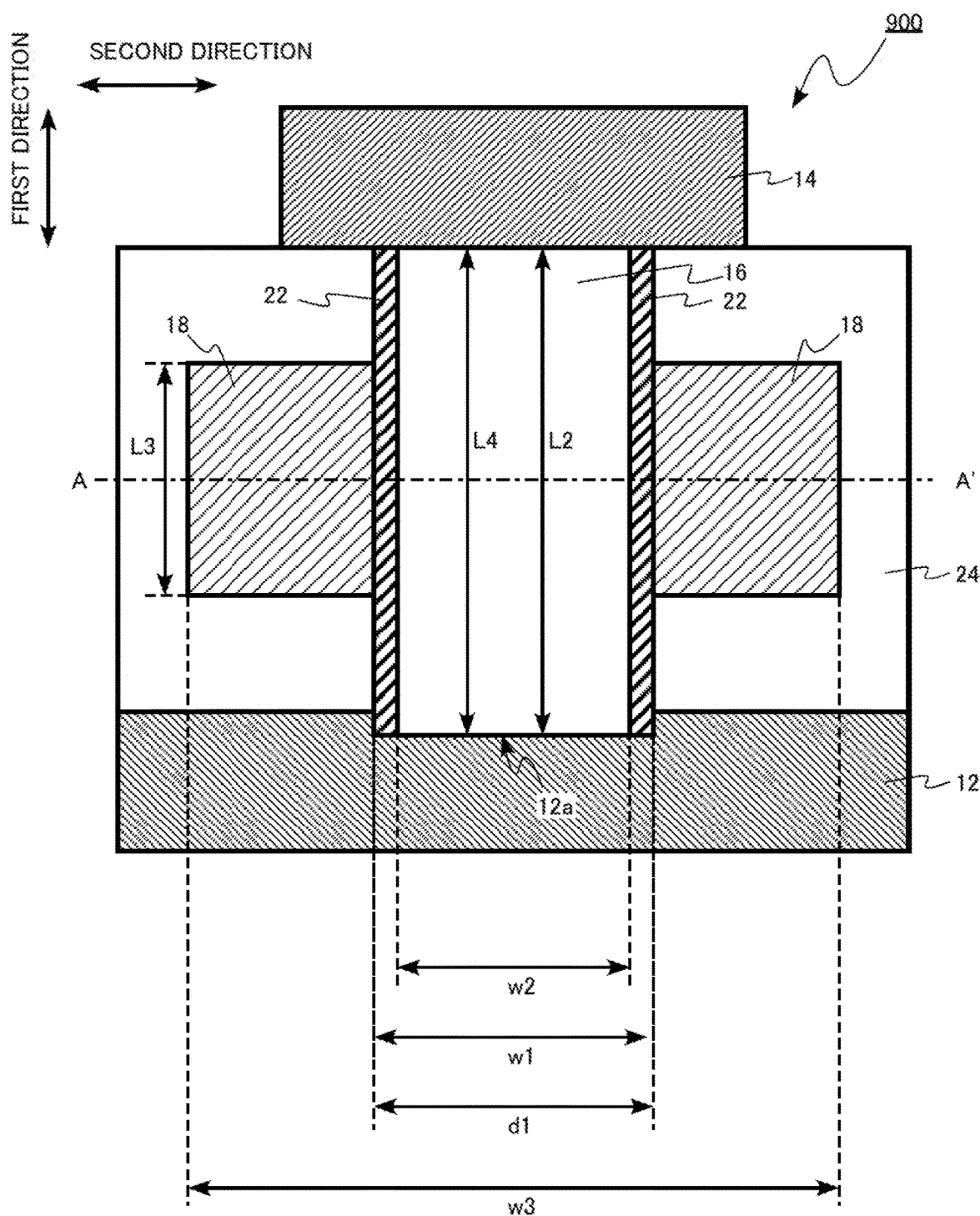
FIG. 10 is a schematic cross-sectional view of a semiconductor device of a comparative example.

FIG. 10 is a schematic cross-sectional view of a semiconductor device of a comparative embodiment. The semiconductor device of the comparative embodiment is a transistor 900. The transistor 900 is different from the transistor 100 of the first embodiment in terms that the transistor 900 does not include the first gate insulating layer 20.

For example, it is assumed that a width of an opening for formation of the channel layer 16 is reduced due to a request for scaling-down of the transistor. For example, as a thickness of the second gate insulating layer 22 is reduced by scaling, a gate leakage current increases, which is a problem.

If the thickness of the second gate insulating layer 22 is increased in order to reduce the gate leakage current, a width (w2 in FIG. 10) of the channel layer 16 becomes narrow. When the width w2 of the channel layer 16 is narrowed, the carrier mobility is lowered. In addition, a contact area between the channel layer 16 and the source electrode 12 decreases, and a contact resistance thereof increases. In addition, a contact area between the channel layer 16 and the drain electrode 14 decreases and a contact resistance thereof increases.

Both the decrease of the carrier mobility and the increase of the contact resistance lead to an increase in an on-resistance of the transistor 900, which is a problem.

In the transistor 900 of the comparative embodiment, a distance d1 between portions of the gate electrode 18 that sandwich the channel layer 16 in the second direction is substantially the same as a width w1 of the recess 12a in the second direction.

In the transistor 100 of the first embodiment, the first gate insulating layer 20 is formed in the recess region 55 which has been formed by etching the gate electrode 18 in the lateral direction. Thus, it is possible to thicken a gate insulating layer by the thickness of the first gate insulating layer 20 as compared with the transistor 900 of the comparative embodiment, for example. Therefore, the gate leakage current can be reduced.

For example, when the thickness of the gate insulating layer is set to be the same as that of the transistor 900 of the comparative embodiment, the transistor 100 of the first embodiment can increase the width w2 of the channel layer 16 by the thickness of the first gate insulating layer 20. Therefore, the decrease of the carrier mobility and the increase of the contact resistance are suppressed, and the on-resistance can be reduced.

Accordingly, the transistor characteristics are improved in the transistor 100 of the first embodiment as compared with the transistor 900 of the comparative embodiment.

The distance d1 between the portions of the gate electrode 18 that sandwich the channel layer 16 in the second direction is preferably 0.8 times or more of the width w3 of the gate electrode 18 in the second direction in the transistor 100 of the first embodiment. When the distance is below the above range, there is a risk that it is difficult to sufficiently reduce the gate leakage current or the on-resistance.

The distance d1 between the portions of the gate electrode 18 that sandwich the channel layer 16 in the second direction is preferably between 1.1 times and 1.5 times of the width w1 of the recess 12a in the second direction. When the distance is below the above range, there is a risk that it is difficult to sufficiently reduce the gate leakage current or the on-resistance. It is difficult to set the distance to exceed the above range in terms of manufacture.

The second gate insulating layer 22 is preferably silicon oxide in the transistor 100 of the first embodiment. A high-quality interface is easily formed, and high carrier mobility is easily realized in an interface between the oxide semiconductor layer of the channel layer 16 and the silicon oxide.

The material of the first gate insulating layer 20 is preferably a material having a higher dielectric constant than silicon oxide, that is, a so-called high-k material. As the high-k material is applied to the first gate insulating layer 20, an on-current increases and the on-resistance decreases. For example, aluminum oxide or hafnium oxide, which is the high-k material, can be applied for the first gate insulating layer 20.

It is preferable that the first gate insulating layer 20 be aluminum oxide or hafnium oxide and the second gate insulating layer 22 be silicon oxide. With this combination, a dipole is formed between the first gate insulating layer 20 and the second gate insulating layer 22, and a threshold voltage of the transistor 100 rises. Therefore, the channel leakage current during the off-operation is reduced.

The first gate insulating layer 20 is preferably a material capable of trapping carriers. The threshold voltage of the transistor 100 can be adjusted by trapping the carriers in the first gate insulating layer 20.

For example, the threshold voltage of the transistor 100 rises as electrons are trapped in the first gate insulating layer 20. For example, a material containing silicon nitride or silicon oxynitride can be applied for the first gate insulating layer 20 as a material for trapping the electrons.

For example, the threshold voltage of the transistor 100 drops as holes are trapped in the first gate insulating layer 20.

As described above, it is possible to realize the oxide semiconductor transistor with improved transistor characteristics according to the first embodiment.

Second Embodiment

A semiconductor device of a second embodiment is different from that of the first embodiment in terms of including no second gate insulating layer. Hereinafter, some of the content overlapping with that in the first embodiment will not be described.

Figure 11:
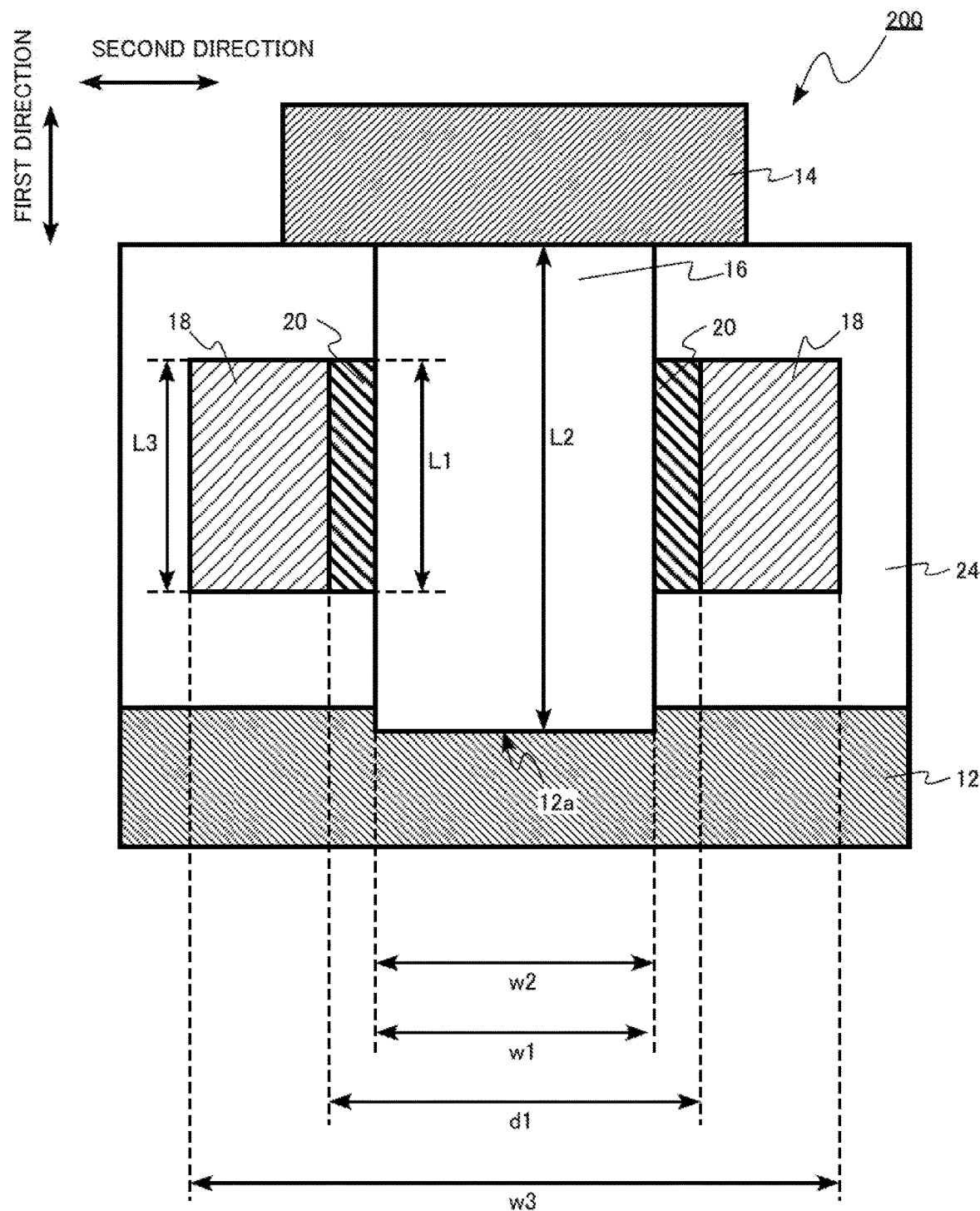
FIG. 11 is a schematic cross-sectional view of a semiconductor device of a second embodiment.

FIG. 11 is a schematic cross-sectional view of the semiconductor device of the second embodiment.

The semiconductor device of the second embodiment is a transistor 200. The transistor 200 is an oxide semiconductor transistor including an oxide semiconductor as a channel layer. The transistor 200 is a so-called SGT in which a gate electrode is provided to surround the channel layer. The transistor 200 is a so-called vertical transistor.

The transistor 200 includes the source electrode 12 (first electrode), the drain electrode 14 (second electrode), the channel layer 16 (oxide semiconductor layer), the gate electrode 18, the first gate insulating layer 20, and the interlayer insulating layer 24.

The transistor 200 of the second embodiment can be manufactured by omitting the formation of the second gate insulating layer 22 (FIG. 8) in the method for manufacturing the transistor 100 of the first embodiment.

According to the transistor 200 of the second embodiment, for example, it is possible to increase a width (w2 in FIG. 11) of the channel layer 16 in a second direction orthogonal to a first direction since the second gate insulating layer 22 is not provided. Therefore, a decrease of carrier mobility and an increase of a contact resistance are suppressed, and an on-resistance can be reduced.

As described above, it is possible to realize the oxide semiconductor transistor capable of further reducing the on-resistance according to the second embodiment.

Third Embodiment

A semiconductor device of a third embodiment is different from that of the first embodiment in terms of including at least one of a first oxide layer provided between the first electrode and the oxide semiconductor layer and made of a different material from the oxide semiconductor layer, and a second oxide layer provided between the second electrode and the oxide semiconductor layer and made of a different material from the oxide semiconductor layer. Hereinafter, some of the content overlapping with that in the first embodiment will not be described.

Figure 12:
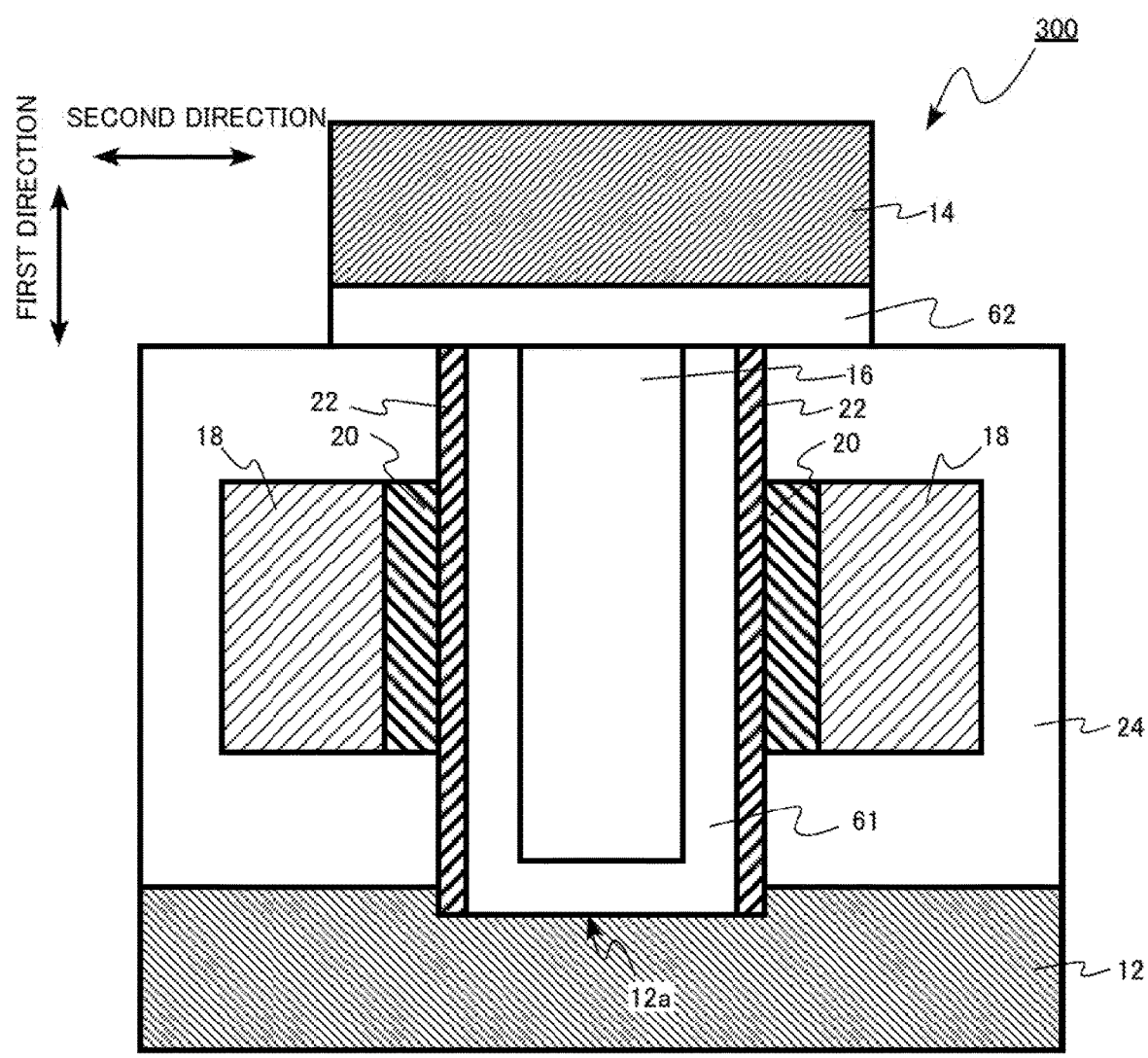
FIG. 12 is a schematic cross-sectional view of a semiconductor device of a third embodiment.

FIG. 12 is a schematic cross-sectional view of the semiconductor device of the third embodiment.

The semiconductor device of the third embodiment is a transistor 300. The transistor 300 is an oxide semiconductor transistor including an oxide semiconductor as a channel layer. The transistor 300 is a so-called SGT in which a gate electrode is provided to surround the channel layer. The transistor 300 is a so-called vertical transistor.

The transistor 300 includes the source electrode 12 (first electrode), the drain electrode 14 (second electrode), the channel layer 16 (oxide semiconductor layer), the gate electrode 18, the first gate insulating layer 20, the second gate insulating layer 22, the interlayer insulating layer 24, an auxiliary layer 61 (first oxide layer), and an auxiliary layer 62 (second oxide layer).

The auxiliary layer 61 is provided at least between the source electrode 12 and the channel layer 16. The auxiliary layer 61 is an example of the first oxide layer. A material of the auxiliary layer 61 is different from a material of the channel layer 16. The auxiliary layer 61 has a function of reducing a resistance between the source electrode 12 and the channel layer 16.

As illustrated in FIG. 12, the auxiliary layer 61 can also be provided between the first, gate insulating layer 20 and the channel layer 16. For example, it is possible to reduce an on-resistance of the transistor 300 by providing the auxiliary layer 61 between the first gate insulating layer 20 and the channel layer 16.

The auxiliary layer 62 is provided between the drain electrode 14 and the channel layer 16. The auxiliary layer 62 is an example of the second oxide layer. A material of the auxiliary layer 62 is different from the material of the channel layer 16. The auxiliary layer 62 has a function of reducing a resistance between the drain electrode 14 and the channel layer 16.

For example, when the source electrode 12 and the drain electrode 14 are metal, oxygen is supplied from the oxide semiconductor of the channel layer 16, and the contact resistance is reduced due to oxygen vacancies in the oxide semiconductor of the channel layer 16. However, when oxygen is further supplied from the oxide semiconductor of the channel layer 16 and oxygen vacancies occur in the entire oxide semiconductor of the channel layer 16, the oxide semiconductor of the channel layer 16 becomes a conductor and the transistor does not operate.

In the transistor 300 of the third embodiment, when the auxiliary layer 61 and the auxiliary layer 62 supply oxygen to the source electrode 12 and the drain electrode so that oxygen vacancies occur, the auxiliary layer 61 and the auxiliary layer 62 function as contact resistance reducing layers.

The auxiliary layer 61 and the auxiliary layer 62 are made of an oxide from the viewpoint of causing the oxygen vacancies to function as the contact resistance reducing layer. In addition, dissociation energy of oxygen of the auxiliary layer 61 and the auxiliary layer 62 is made smaller than dissociation energy of oxygen of the channel layer 16.

As the auxiliary layer 61 and the auxiliary layer 62 function as the contact resistance reducing layer, the contact resistance between each of the source electrode 12 and the drain electrode 14 and the channel layer 16 is reduced. Accordingly, the on-resistance of the transistor 300 is reduced.

For example, when the channel layer 16 is IGZO, it is possible to apply gallium oxide containing zinc (Zn), aluminum (Al), tin (Sn), indium (In), or the like, such as indium oxide and gallium oxide, as the materials of the auxiliary layer 61 and the auxiliary layer 62.

When the auxiliary layer 61 is provided between the first gate insulating layer 20 and the channel layer 16, the material of the auxiliary layer 61 is preferably a material having a larger bandgap than the oxide semiconductor of the channel layer 16. The material of the auxiliary layer 61 is, for example, an oxide semiconductor having a larger bandgap than the oxide semiconductor of the channel layer 16. With this configuration, a channel is formed between the auxiliary layer 61 and the channel layer 16, and the high carrier mobility can be realized based on the similar principle as a so-called high electron mobility transistor (HEMT). Therefore, the on-resistance of the transistor 300 is reduced.

For example, when the channel layer 16 is IGZO, it is possible to apply gallium oxide containing zinc (Zn), aluminum (Al), tin (Sn), silicon (Si), or the like, such as indium oxide and gallium oxide, as the material of the auxiliary layer 61.

As described above, it is possible to realize the oxide semiconductor transistor capable of further reducing the on-resistance according to the third embodiment.

Fourth Embodiment

A semiconductor device of a fourth embodiment is different from that of the first embodiment in terms of including a capacitor connected to one of the first electrode and the second electrode and a first wiring connected to the another one of the first electrode and the second electrode and a second wiring crossing the first wiring and connected to the gate electrode. Hereinafter, some of the content overlapping with that in the first embodiment will not be described.

The semiconductor device of the fourth embodiment is a semiconductor memory 400. The semiconductor device of the fourth embodiment is a dynamic random access memory (DRAM). In the semiconductor memory 400, the transistor 100 of the first embodiment is used as a switching transistor of a memory cell MC of the DRAM.

Figure 13:
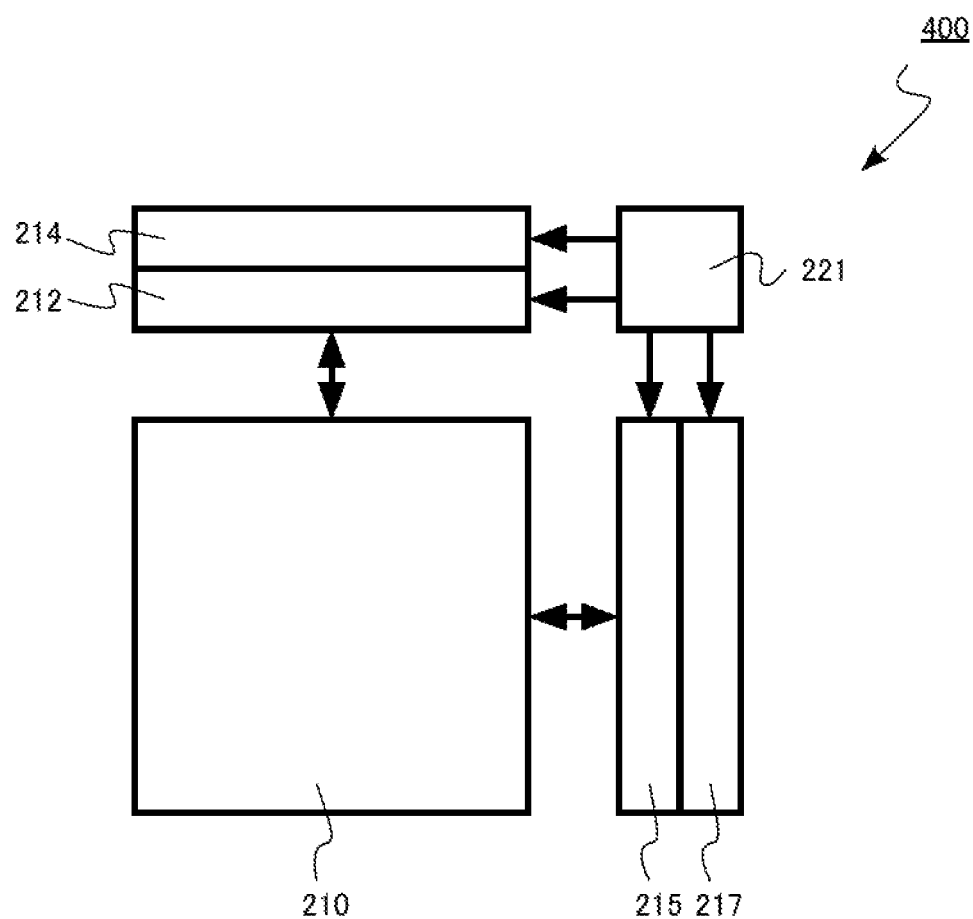
FIG. 13 is a block diagram of a semiconductor device of a fourth embodiment.

FIG. 13 is a block diagram of the semiconductor device of the fourth embodiment.

As illustrated in FIG. 13, the semiconductor memory 400 includes a memory cell array 210, a word line driver circuit 212, a row decoder circuit 214, a sense amplifier circuit 215, a column decoder circuit 217, and a control circuit 221.

Figure 14:
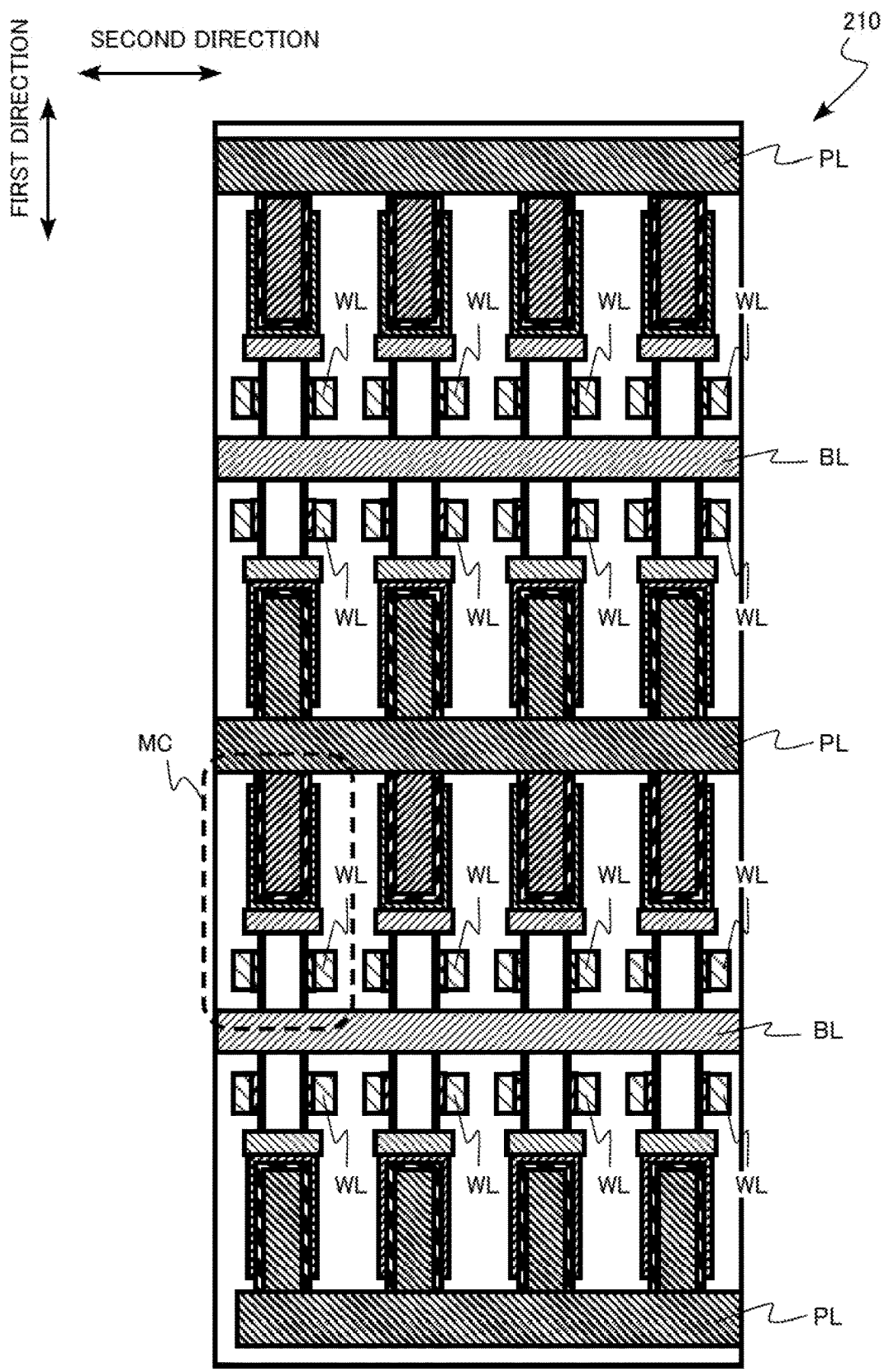
FIG. 14 is a schematic cross-sectional view of a memory cell array of the semiconductor device of the fourth embodiment.
Figure 15:
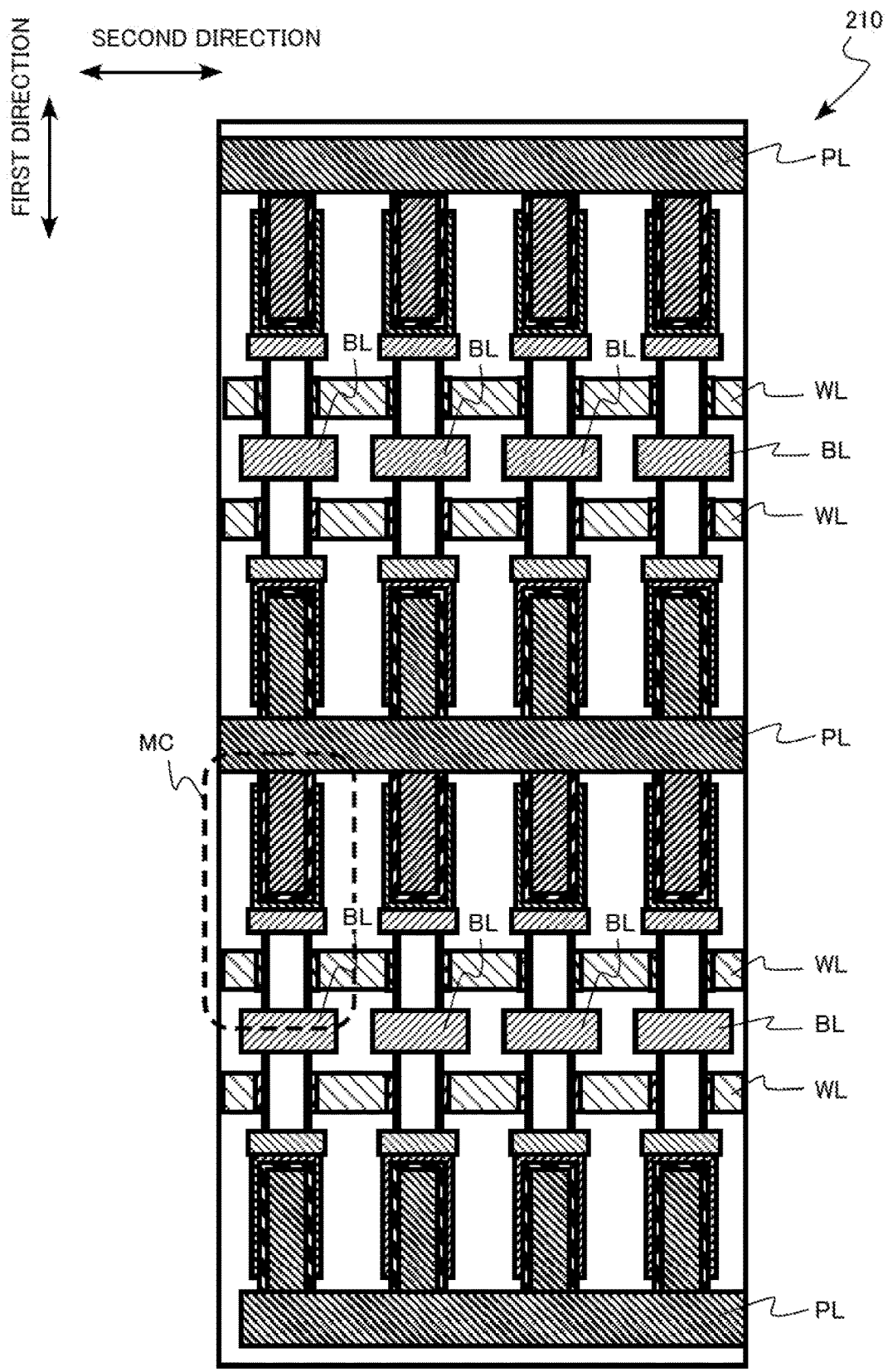
FIG. 15 is a schematic cross-sectional view of the memory cell array of the semiconductor device of the fourth embodiment.

FIGS. 14 and 15 are schematic cross-sectional views of the memory cell array of the semiconductor device of the fourth embodiment. FIG. 14 is the cross-sectional view of a plane including a first direction and a second direction, and FIG. 15 is the cross-sectional view of a plane including the first direction and a third direction. The third direction is a direction perpendicular to the first direction and the second direction. The memory cell array 210 of the fourth embodiment has a three-dimensional structure in which the memory cells MC are three-dimensionally disposed. In FIGS. 14 and 15, a region surrounded by a broken line represents the single memory cell MC.

The memory cell array 210 includes, for example, a plurality of word lines WL (second wiring). The word line WL is an example of the second wiring. The word line WL extends in the third direction. A bit line BL (first wiring) extends in the second direction. The bit line BL is an example of the first wiring. For example, the word line WL and the bit line BL vertically cross each other. The memory cells MC are disposed at intersections of the word lines WL and the bit lines BL.

The memory cell array 210 has a plurality of plate electrode lines PL. The plate electrode line PL is connected to a plate electrode of each memory cell.

The plurality of word lines WL are electrically connected to the row decoder circuit 214. The plurality of bit lines BL are electrically connected to the sense amplifier circuit 215.

The row decoder circuit 214 has a function of selecting the word line WL according to an input row address signal. The word line driver circuit 212 has a function of applying a predetermined voltage to the word line WL selected by the row decoder circuit 214.

The column decoder circuit 217 has a function of selecting the bit line BL according to an input column address signal. The sense amplifier circuit 215 has a function of applying a predetermined voltage to the bit line BL selected by the column decoder circuit 217. The sense amplifier circuit 215 further has a function of detecting and amplifying a potential of the bit line BL.

The control circuit 221 has a function of controlling the word line driver circuit 212, the row decoder circuit 214, the sense amplifier circuit 215, the column decoder circuit 217, and other circuits (not illustrated).

The circuit, such as the word line driver circuit 212, the row decoder circuit 214, the sense amplifier circuit 215, the column decoder circuit 217, and the control circuit 221, is formed of, for example, a transistor and a wiring layer using a semiconductor layer (not illustrated).

The word line WL and the bit line BL are, for example, metal. The word line WL and the bit line BL are, for example, titanium nitride, tungsten, or a stacked structure of titanium nitride and tungsten.

Figure 16:
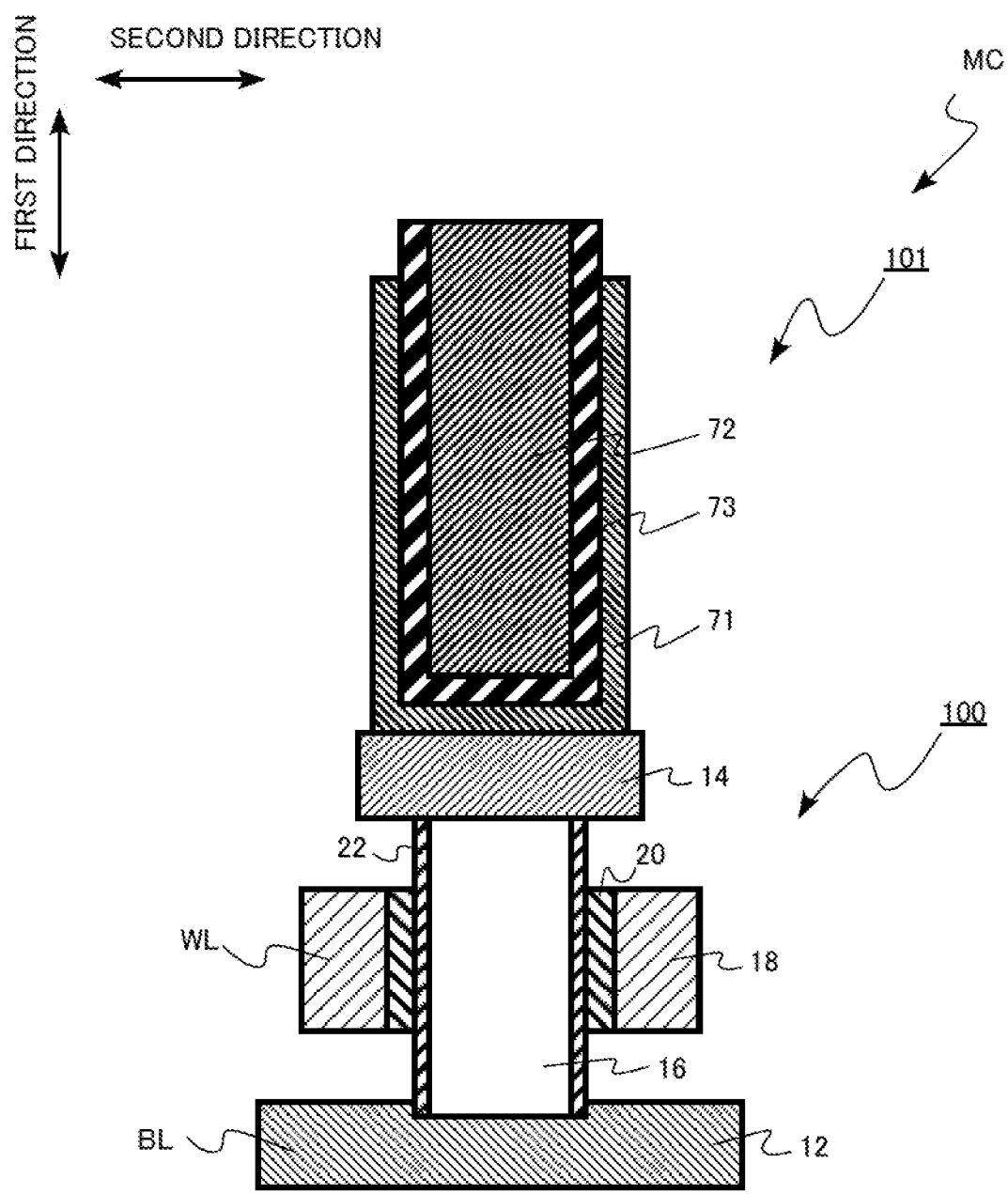
FIG. 16 is a schematic cross-sectional view of a memory cell of the semiconductor device of the fourth embodiment.

FIG. 16 is a schematic cross-sectional view of the memory cell of the semiconductor device of the fourth embodiment. The memory cell MC includes the transistor 100 and a capacitor 101.

The transistor 100 includes a source electrode 12 (first electrode), a drain electrode 14 (second electrode), a channel layer 16 (oxide semiconductor layer), a gate electrode 18, a first gate insulating layer 20, a second gate insulating layer 22, and an interlayer insulating layer 24.

The capacitor 101 includes a cell electrode 71, a plate electrode 72, and a capacitor insulating film 73.

The cell electrode 71 of the capacitor 101 is connected to the drain electrode 14. The bit line BL is connected to the source electrode 12. The word line WL is connected to the gate electrode 18. Incidentally, the case of simultaneously forming the bit line BL and the source electrode 12, and the word line WL and the gate electrode 18 using the same material is illustrated, as an example, in FIGS. 14, 15, and 16. The bit line BL and the source electrode 12, and the word line WL and the gate electrode 18 may be formed separately using different materials, respectively.

According to the fourth embodiment, the semiconductor memory with improved memory characteristics is realized by using the transistor 100 of the first embodiment, as the switching transistor of the DRAM.

Although the case where the transistor 100 of the first embodiment is used as the switching transistor of the DRAM has been described as an example in the fourth embodiment, it is also possible to apply the transistor 200 of the second embodiment or the transistor 300 of the third embodiment instead of the transistor 100 of the first embodiment.

While certain embodiments have been described, these embodiments have been presented by way of example only, and are not intended to limit the scope of the inventions. Indeed, the semiconductor device and the method for manufacturing the same described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
   a first electrode;
   a second electrode;
   an oxide semiconductor layer provided between the first electrode and the second electrode and extending in a first direction;
   a gate electrode surrounding the oxide semiconductor layer;
   a first gate insulating layer provided between the gate electrode and the oxide semiconductor layer in a second direction orthogonal to the first direction, the first gate insulating layer surrounding the oxide semiconductor layer, and the first gate insulating layer having a length in the first direction shorter than a length of the oxide semiconductor layer in the first direction;
   a second gate insulating layer provided between the first gate insulating layer and the oxide semiconductor layer in the second direction, the second gate insulating layer surrounding the oxide semiconductor layer, and the second gate insulating layer having a length in the first direction longer than a length of the first gate insulating layer in the first direction;
   a first oxide layer provided between the first electrode and the oxide semiconductor layer and made of a different material than the oxide semiconductor layer; and
   a second oxide layer provided between the second electrode and the oxide semiconductor layer and made of a different material than the oxide semiconductor layer.

2. The semiconductor device according to claim 1, wherein a length of the first gate insulating layer in the first direction is substantially equal to a length of the gate electrode in the first direction.

3. The semiconductor device according to claim 1, wherein materials of the first gate insulating layer and the second gate insulating layer are different.

4. The semiconductor device according to claim 1, wherein the second gate insulating layer contains silicon oxide.

5. The semiconductor device according to claim 4, wherein the first gate insulating layer contains aluminum oxide or hafnium oxide.

6. The semiconductor device according to claim 1, wherein the first gate insulating layer contains silicon oxide.

7. The semiconductor device according to claim 3, wherein the first gate insulating layer contains silicon nitride or silicon oxynitride.

8. The semiconductor device according to claim 1, wherein the first oxide layer is provided between the second gate insulating layer and the oxide semiconductor layer.

9. The semiconductor device according to claim 1, wherein the oxide semiconductor layer contains indium.

10. A semiconductor device comprising:
    a first electrode;
    a second electrode;
    an oxide semiconductor layer provided between the first electrode and the second electrode and extending in a first direction;
    a gate electrode surrounding the oxide semiconductor layer; and
    a first gate insulating layer provided between the gate electrode and the oxide semiconductor layer, the first gate insulating layer surrounding the oxide semiconductor layer,
    wherein the first electrode has a first plane and a second plane opposite to the first plane, a distance between the first plane and the oxide semiconductor is smaller than a distance between the second plane and the oxide semiconductor, the first plane has a recess, and the oxide semiconductor is positioned between the recess and the second electrode and
    when a direction orthogonal to the first direction is defined as a second direction, in a cross section parallel to the first direction and including the oxide semiconductor, a distance in the second direction between portions of the gate electrode that sandwich the oxide semiconductor layer is larger than a width of the recess in the second direction.

11. The semiconductor device according to claim 10, further comprising a second gate insulating layer provided between the first gate insulating layer and the oxide semiconductor layer, the second gate insulating layer surrounding to oxide semiconductor layer.

12. The semiconductor device according to claim 11, wherein materials of the first gate insulating layer and the second gate insulating layer are different.

13. The semiconductor device according to claim 1, further comprising a capacitor connected to one of the first electrode and the second electrode.

14. The semiconductor device according to claim 13, further comprising:
  a first wiring connected to another one of the electrode and the second electrode; and
  a second wiring crossing the first wiring and connected to the gate electrode.

15. The semiconductor device according to claim 10, further comprising a capacitor connected to one of the first electrode and the second electrode.

16. The semiconductor device according to claim 15, further comprising:
  a first wiring connected to another one of the first electrode and the second electrode; and
  a second wiring crossing the first wiring and connected to the gate electrode.

17. A semiconductor device comprising:
  a first electrode;
  a second electrode;
  an oxide semiconductor layer provided between the first electrode and the second electrode and extending in a first direction;
  a gate electrode surrounding the oxide semiconductor layer;
  a first gate insulating layer provided between the gate electrode and the oxide semiconductor layer in a second direction orthogonal to the first direction, the first gate insulating layer surrounding the oxide semiconductor layer, and the first gate insulating layer having a length in the first direction shorter than a length of the oxide semiconductor layer in the first direction;
  a second gate insulating layer provided between the first gate insulating layer and the oxide semiconductor layer in the second direction, the second gate insulating layer surrounding the oxide semiconductor layer, the second gate insulating layer having a length in the first direction longer than a length of the first gate insulating layer in the first direction, and materials of the first gate insulating layer and the second gate insulating layer being different;
  a first oxide layer provided between the first electrode and the oxide semiconductor layer, the first oxide layer provided between the second gate insulating layer and the oxide semiconductor layer, and the first oxide layer made of a different material from the oxide semiconductor layer; and
  a second oxide layer provided between the second electrode and the oxide semiconductor layer and made of a different material from the oxide semiconductor layer,
  wherein the first electrode has a first plane and a second plane opposite to the first plane, a distance between the first plane and the oxide semiconductor is smaller than a distance between the second plane and the oxide semiconductor, the first plane has a recess, and the oxide semiconductor is positioned between the recess and the second electrode, and
  in a cross section parallel to the first and second directions and including the oxide semiconductor, a distance in the second direction between portions of the gate electrode that sandwich the oxide semiconductor layer is larger than a width of the recess in the second direction.

* * * * *